United States Patent
Iucolano

(10) Patent No.: US 10,050,136 B2
(45) Date of Patent: Aug. 14, 2018

(54) HIGH-POWER AND HIGH-FREQUENCY HETEROSTRUCTURE FIELD-EFFECT TRANSISTOR

(71) Applicant: STMICROELECTRONICS S.R.L., Agrate Brianza (IT)

(72) Inventor: Ferdinando Iucolano, Gravina di Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/371,012

(22) Filed: Dec. 6, 2016

(65) Prior Publication Data

US 2017/0345918 A1 Nov. 30, 2017

(30) Foreign Application Priority Data

May 30, 2016 (EP) ..................... 16425048

(51) Int. Cl.

| H01L 31/0256 | (2006.01) |
|---|---|
| H01L 29/778 | (2006.01) |
| H01L 29/40 | (2006.01) |
| H01L 29/20 | (2006.01) |
| H01L 29/66 | (2006.01) |

(Continued)

(52) U.S. Cl.
CPC ........ *H01L 29/778* (2013.01); *H01L 29/2003* (2013.01); *H01L 29/402* (2013.01); *H01L 29/66431* (2013.01); *H01L 29/66462* (2013.01); *H01L 29/7786* (2013.01); *H01L 29/41766* (2013.01); *H01L 29/4236* (2013.01)

(58) Field of Classification Search
CPC .................. H01L 29/2003; H01L 29/778

USPC .......................................................... 257/76
See application file for complete search history.

(56) References Cited

U.S. PATENT DOCUMENTS 8,530,978 B1 9/2013 Chu et al.
9,171,730 B2 * 10/2015 Chowdhury .......... H01L 21/283
(Continued)

FOREIGN PATENT DOCUMENTS

CN 102903762 A 1/2013

OTHER PUBLICATIONS

Chu et al., "V-Gate GaN HEMTs for X-Band Power Applications," *IEEE Electron Device Letters* 29(9):974-976, 2008.
(Continued)

*Primary Examiner* — David S Blum
(74) *Attorney, Agent, or Firm* — Seed Intellectual Property Law Group LLP

(57) ABSTRACT

In an HEMT device, a gate region is formed in a wafer having a channel layer, a barrier layer, and a passivation layer, overlying each other. Drain and source electrodes are formed in the wafer, on different sides of the gate region. A dielectric layer is formed over the gate region and over the passivation layer. Selective portions of the dielectric layer are removed by a plurality of etches so as to form one or more cavities between the gate region and the drain electrode. The one or more cavities have a plurality of steps at an increasing distance from the wafer moving from the gate region to the drain electrode. The cavity is then filled with conductive material to form a field plate coupled to the source electrode, extending over the gate region, and having a surface facing the wafer and having a plurality of steps.

16 Claims, 6 Drawing Sheets

(51) Int. Cl.
  *H01L 29/417*    (2006.01)
  *H01L 29/423*    (2006.01)

(56) References Cited

U.S. PATENT DOCUMENTS 9,257,513 B1    2/2016   Liu
2014/0264431 A1    9/2014   Lal

OTHER PUBLICATIONS

Chu et al., "1200-V Normally Off GaN-on-Si Field-Effect Transistors With Low Dynamic ON-Resistance," *IEEE Electron Device Letters* 32(5):632-634, 2011.
Dora et al., "High Breakdown Voltage Achieved on AlGaN/GaN HEMTs With Integrated Slant Field Plates," *IEEE Electron Device Letters* 27(9):713-715, 2006.
Lin, "Market and Technology Trends in WBG Materials for Power Electronics Applications," CS MANTECH Conference, May 18-21, 2015, Scottsdale, Arizona, US, pp. 33-36. (4 pages).
Xing et al., "High Breakdown Voltage AlGaN-GaN HEMTs Achieved bv Multiple Field Plates," *IEEE Electron Device Letters* 25(4):161-163, 2004.

* cited by examiner

HIGH-POWER AND HIGH-FREQUENCY HETEROSTRUCTURE FIELD-EFFECT TRANSISTOR

BACKGROUND

Technical Field

The present disclosure relates to a high-power and high-frequency heterostructure field-effect transistor.

Description of the Related Art

As is known, AlGaN/GaN heterostructures have drawn high interest for manufacturing high-power and high-frequency field-effect transistors, by virtue of the high breakdown voltage of the material and the high density and mobility of carrier ions in the two-dimensional electron gas (2DEG).

High-electron-mobility transistors (HEMTs) based on AlGaN/GaN are generally grown on a silicon substrate, since cheap substrates based of gallium nitride (GaN) are not available. Therefore, the device is horizontal and the source, drain, and gate electrodes are arranged on the upper surface of the wafer. Thus, the wafer breakdown voltage is linked both to the vertical breakdown voltage and to the lateral distance between the source and the drain electrodes.

Although gallium nitride and its alloys are wide band-gap and high breakdown semiconductors, one of the critical aspects of HEMT power devices of gallium nitride is obtaining a good electrical field distribution during switch-off.

Therefore, the structure of an HEMT is carefully studied in order to optimize the electrical field distribution and to allow the device to operate at a maximum switching rate, when subjected to a high voltage variation. Without an appropriate shaping of the existing electrical field, in fact, the latter may cause injection of electrons in traps, thus degrading the output current and the on-state resistance during switching. This phenomenon is frequently referred to as dynamic degradation, current drop, or DC-RF dispersion.

To prevent this phenomenon, in microwave applications, it has been proposed to use a V-shaped gate region with an integrated slant field plate (see, e.g., Y. Dora, et al. "High Breakdown Voltage Achieved on AlGaN/GaN HEMTs With Integrated Slant Field Plates", IEEE ELECTRON DEVICE LETTERS, Vol. 27, N. 9, September 2006, pp. 713-715 and R. Chu et al. "V-Gate GaN HEMTs for X-Band Power Applications", IEEE ELECTRON DEVICE LETTERS, Vol. 29, No. 9, September 2008, pp. 974-976). For high-voltage applications, the use of a structure has also been proposed having a plurality of separate, overlying field plates, to increase the operating voltage (multiple-field-plate solution, see, e.g., H. Xing et al. "High-Breakdown Voltage AlGaN/GaN HEMTs Achieved by Multiple Field Plates", IEEE ELECTRON DEVICE LETTERS, Vol. 25, No. 4, April 2004, pp. 161-163). Another known solution (see R. Chu et al. "1200-V Normally Off GaN-on-Si Field-Effect Transistors with Low Dynamic On-Resistance", IEEE ELECTRON DEVICE LETTERS, VOL. 32, No. 5, May 2011, pp. 632-634) shows a different multiple field plate having overlying portions, in mutual electrical contact. A similar approach is described in U.S. Pat. No. 8,530,978 B1, but with a sloped field plate connected to the source electrode.

In particular, the device described in U.S. Pat. No. 8,530,978 B1 comprises a stack of AlGaN/GaN epitaxial layers on a silicon substrate. A passivation layer of dielectric material covers the stack of epitaxial layers and accommodates source and drain electrodes, a gate electrode, a first field plate connected to the gate region, and a second field plate connected to the source electrode. The second field plate has a sloped bottom surface. The first field plate, connected to the gate region, is intended to prevent charge trapping at low voltage.

The sloped shape of the second field plate is obtained by exposing a photoresist through a greyscale mask. This mask allows to modulate the intensity of the passing light and to obtain a sloped profile in the photoresist. This profile is then transferred onto the underlying dielectric layer by dry etching. The process for forming the sloped field plate is simpler and faster than the process for forming a plurality of separate field plates since the latter requires numerous successive metal deposition and definition steps.

The presence of a sloped field plate enables the increase of the dynamic on-state resistance at 600 V to be reduced from 47%, that may be achieved with the multiple-field-plate device, to 19%. The improvement of performance is thought to be due to a more linear profile of the electrical field, which can be achieved by virtue of the sloped field plate.

However, also the solution with sloped field plate is not free from disadvantages. In fact, it involves a complex manufacturing process and a final planarization step. Forming the sloped field plate is thus costly and may not be sufficiently controllable.

BRIEF SUMMARY

At least some embodiments of the present disclosure provide a different manufacturing process and a new HEMT device having a field plate with a sloped surface.

According to the present disclosure, a manufacturing process and a heterostructure field-effect transistor are provided.

In practice, to form the field plate, the dielectric layer overlying the gate, drain, and source regions is subjected to a plurality of successive etching steps such as to form a cavity, connected or not connected, with a bottom surface or an underside envelope having a plurality of steps, thereby meaning a plurality of discontinuous surface portions adjacent to each other, wherein each surface portion extends at a different distance from the underlying wafer with respect to adjacent surface portions.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
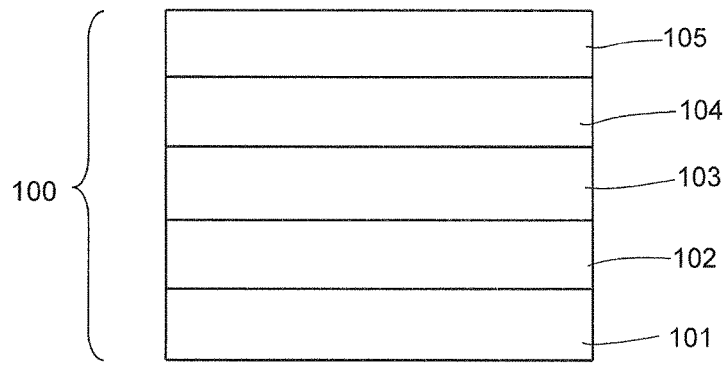
FIGS. 1-11 are cross-sections through a semiconductor material wafer in successive manufacturing steps of a first embodiment of the present field-effect HEMT device.

FIG. 1 shows a portion of a wafer 100 for manufacturing an HEMT device, according to one embodiment of the present device. In particular, the described embodiment regards a heterostructure field-effect transistor of AlGaN/GaN.

The wafer 100 comprises a substrate 101 of, e.g., silicon, silicon carbide (SiC), or sapphire ($Al_2O_3$), overlaid by a buffer layer 102, for example of aluminum gallium nitride (AlGaN) or of indium gallium nitride (InGaN). A channel layer 103 extends on the buffer layer 102 and is here of intrinsic gallium nitride (GaN), having a thickness of, e.g., ca. 10 nm to ca. 10 µm. A barrier layer 104, here of aluminum and gallium nitride (AlGaN) of an intrinsic type, extends on the channel layer 103, in contact therewith, and has a thickness of, e.g., ca. 5 nm and ca. 400 nm. A passivation layer 105 of dielectric material such as silicon nitride ($Si_3N_4$) or silicon oxide ($SiO_2$) extends on the barrier layer 104.

Figure 2:
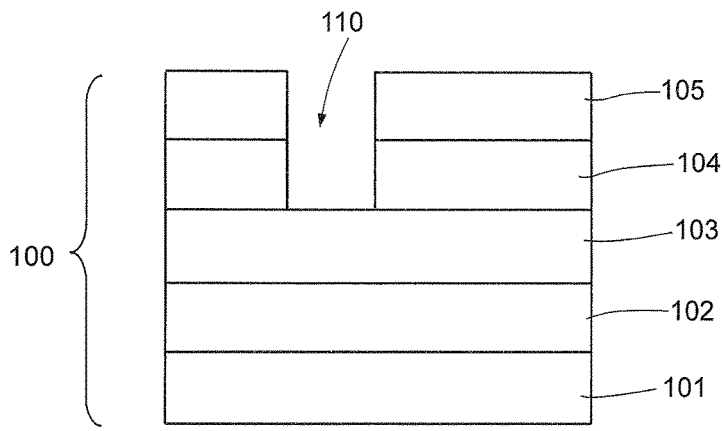

As shown in FIG. 2, the passivation layer 105 and the barrier layer 104 are selectively removed at the portion of the wafer 100 where, in subsequent steps, a gate region of the HEMT device is to be formed. For instance, lithography steps are carried out, including etching of the passivation layer 105 and dry etching of the barrier layer 104 so as to remove selective portions thereof. A trench 110 is thus formed, which extends throughout the thickness of the passivation layer 105 and of the barrier layer 104.

Figure 3:
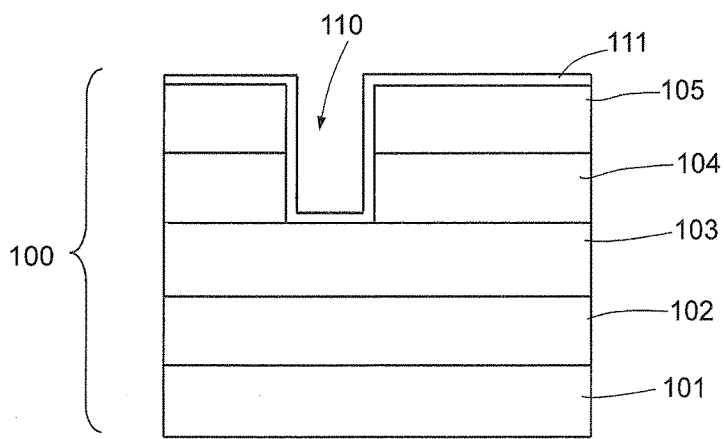

Next, FIG. 3, a gate insulation layer 111 is deposited, for example made of a material chosen from aluminum nitride (AlN), silicon nitride (SiN), aluminum oxide ($Al_2O_3$), or silicon oxide ($SiO_2$). The gate insulation layer 111 may have a thickness of between 1 and 50 nm, for example, 20 nm.

Figure 4:
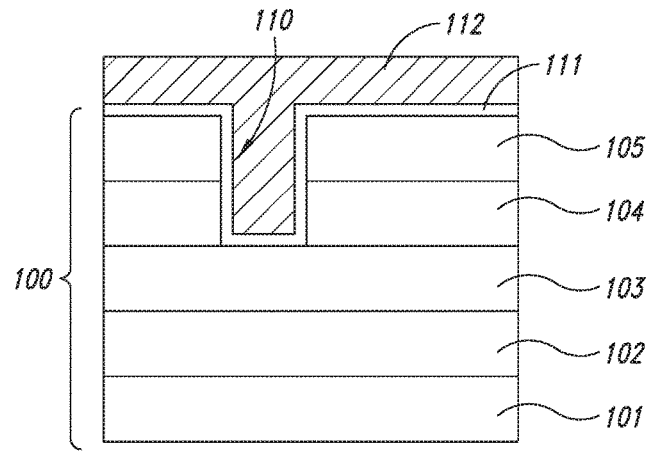

Then, as shown in FIG. 4, a conductive layer 112 is deposited on the gate insulation layer 111 and fills the trench 110. For instance, the conductive layer 112 is made of metal material, such as tantalum (Ta), tantalum nitride (TaN), titanium nitride (TiN), palladium (Pa), tungsten (W), tungsten silicide ($WSi_2$), titanium aluminum (Ti/Al), or nickel gold (Ni/Au).

Figure 5:
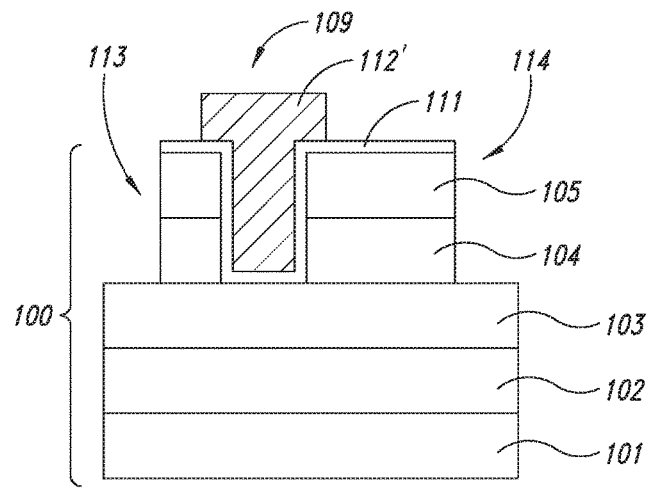

The conductive layer 112 is then selectively removed (FIG. 5), through lithographic and etching steps per se known so as to remove the conductive layer 112 from the wafer 100, except for the portion extending in the trench 110 and for an adjacent portion, projecting from the wafer 100. A gate metallization 112' is thus formed. The gate metallization 112' and the gate insulation layer 111 form, as a whole, the gate region, designated as a whole by 109, of the HEMT device. Then, one or more further masked etching steps of the gate insulation layer 111, of the passivation layer 105, and of the barrier layer 104 are carried out at the areas of the wafer 100 where the source and drain electrodes of the HEMT device are to be formed. In particular, openings 113 and 114 are formed on opposite sides of the gate region 109 and at a distance therefrom.

Figure 6:
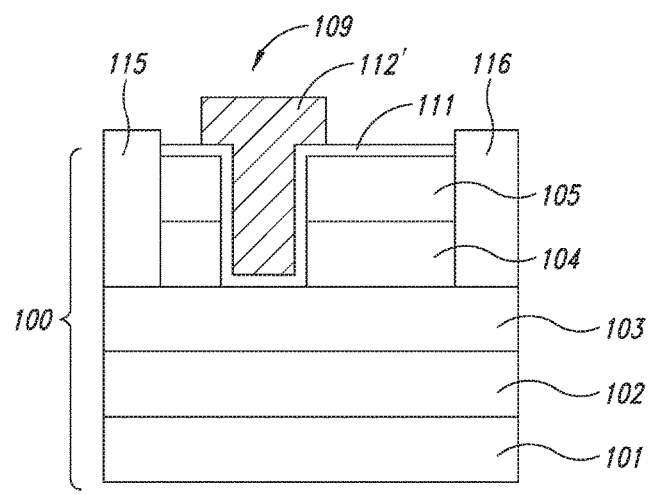

Next, as shown in FIG. 6, ohmic contacts are formed to provide the source and drain electrodes 115, 116. To this end, conductive material is deposited, in particular metal such as titanium (Ti) or aluminum (Al), or their alloys or compounds, by sputtering or evaporation, on the wafer 100 and in particular inside the openings 113, 114. The metal layer thus deposited is then etched so as to remove it from the wafer 100, except for the portions extending in the openings 113 and 114, forming therein, respectively, source and drain electrode electrodes 115, 116.

Figure 7:
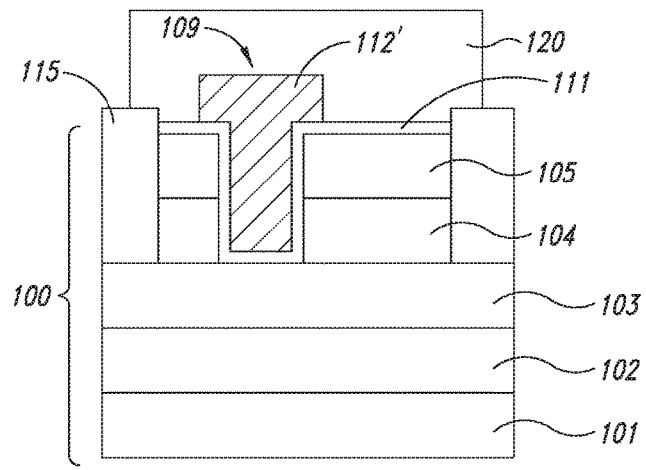

Then, FIG. 7, a dielectric layer 120 is deposited, for example of silicon nitride or silicon oxide or TEOS (tetraethylorthosilicate)/SOG (Spin-On-Glass)/TEOS, which coats the source and drain electrodes 115, 116, the gate region 109, and the gate insulation layer 111. The dielectric layer 120 thus obtained is then planarized (for example via CMP—Chemical Mechanical Polishing). Next, portions of the dielectric layer 120 are selectively removed, by a photolithographic process followed by an etch, for example a dry plasma etch, a wet etch or a combination of these, at the source and drain electrodes 115, 116.

Figure 8:
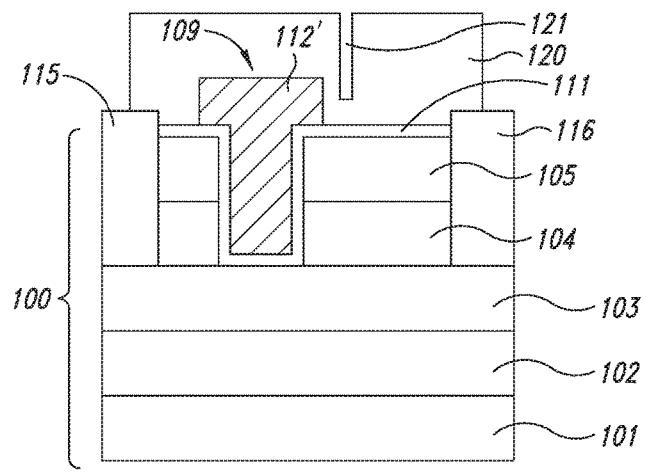

Next, FIG. 8, the dielectric layer 120 is etched, by a lithographic process followed by etching, for example dry plasma etching, wet etching, or a combination of these, to form a first trench 121. The first trench 121 extends directly over the area of the wafer 100 which is arranged between the gate region 109 and the drain electrode 116, through most of the thickness of the dielectric layer 120, but stops at a distance from the gate insulation layer 111, for example at 50 nm.

Figure 9:
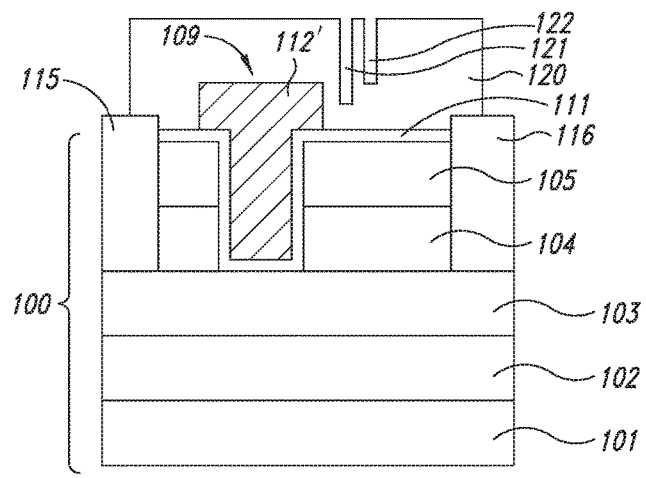

Next, FIG. 9, a second trench 122 is created, with a same process, adjacent to the first trench 121. In particular, the second trench 122 is arranged between the first trench 121 and the vertical line passing through the drain electrode 116 and extends through the dielectric layer 120; moreover, its depth is slightly smaller than the first trench 121, for example its bottom end is arranged at 200 nm from the gate insulation layer 111.

Figure 10:
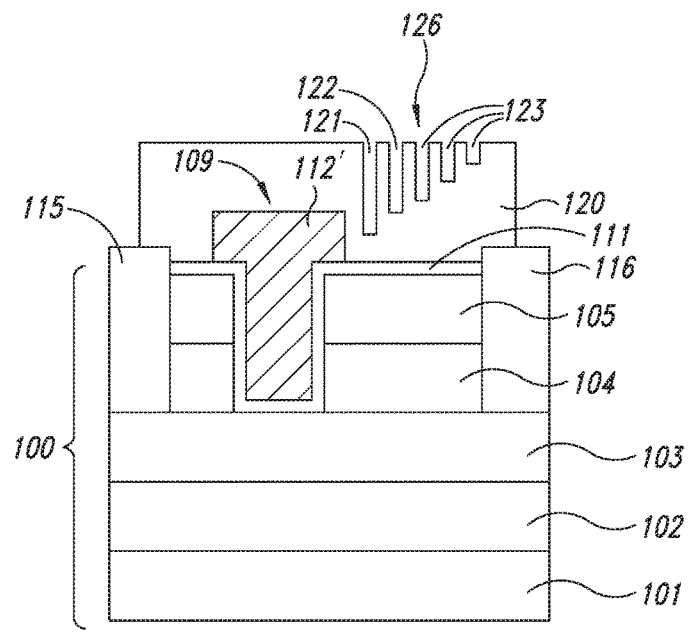

Then, FIG. 10, using the same process as described with reference to FIGS. 8 and 9, a plurality of trenches 123 are formed, adjacent to the second trench 122. The plurality of trenches 123 is arranged between the second trench 122 and the vertical line passing through the drain electrode 116 and extends through the thickness of the dielectric layer 120 so that each trench 123 is less deep than the adjacent one, moving toward the gate region 109, and deeper than the adjacent one, moving toward the drain electrode 116. As a whole, the plurality of trenches 121-123 forms a non-connected cavity 126.

Figure 11:
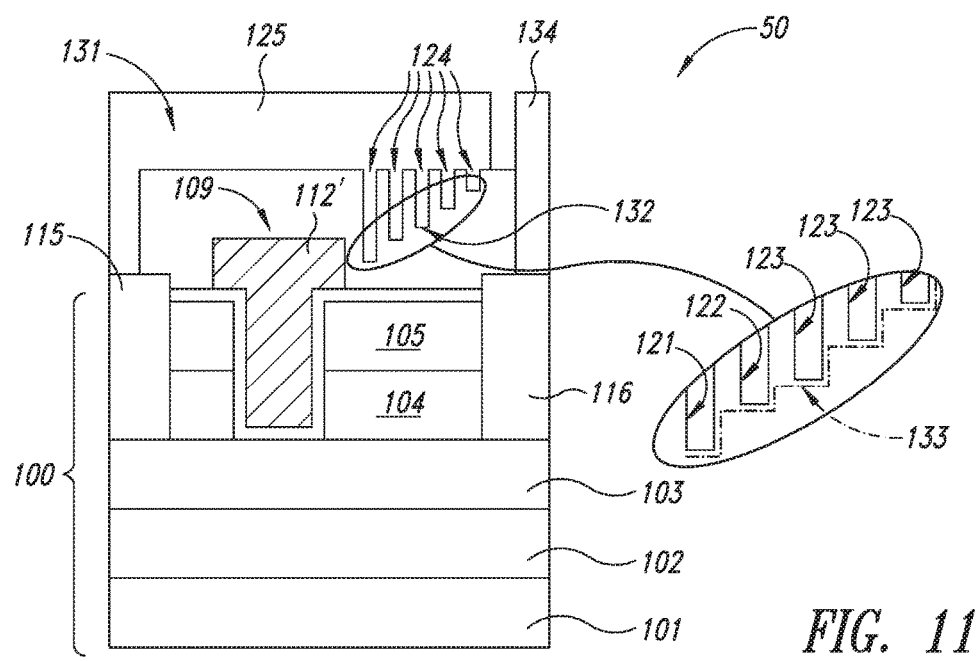

Next, FIG. 11, a metal layer is deposited on the dielectric layer 120. The metal layer is in direct electrical contact with the source electrode 115 and drain electrode 116 where the dielectric layer 120 has been removed. Then, the metal layer is defined, according to a photolithographic process, thereby forming a field plate 131 and a drain contact 134. The field plate 131 comprises a planar portion 125 on the dielectric layer 120 and a projecting region formed by a plurality of fingers 124 projecting inside trenches 121, 122, and 123. The planar portion 125 is in direct electrical contact with the source electrode 115 and forms a source contact. The drain contact 134 is in direct electrical contact with the drain electrode 116.

The field plate 131 thus has, towards the wafer 100, an envelope surface or profile 133 (see in particular the enlarged detail) defined by a plurality of steps 132 having a distance, from the wafer 100, that increases moving from the gate region 109 to the drain electrode 116. In practice, the envelope surface 133 defines on average a surface that is sloped with respect to the surface plane of the wafer 100 and thus allows an optimization of the electrical field to be obtained and therefore a high breakdown voltage also during high-power operation, as discussed previously.

The final wafer 100' thus obtained is thus planar and does not require further planarization steps. After dicing, a plurality of normally off HEMT devices 50 is obtained.

Figure 12:
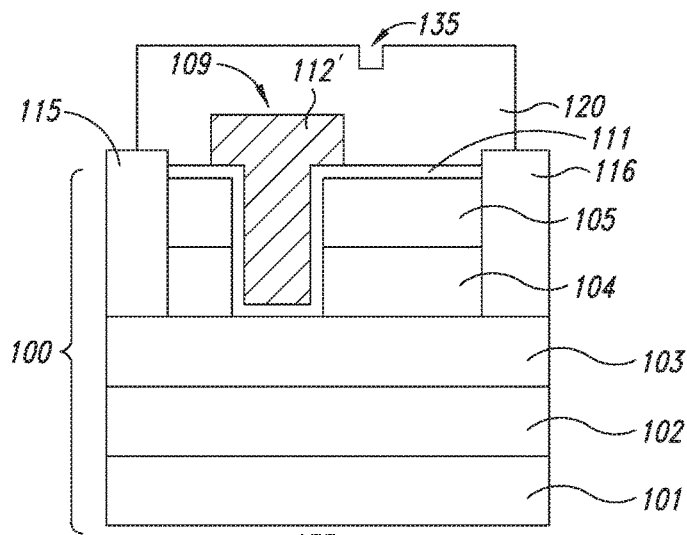
FIGS. 12-15 are cross-sections through a semiconductor material wafer in successive manufacturing steps of a second embodiment of the present field-effect HEMT device.

In a different embodiment, initially the same manufacturing steps are carried out as described previously with reference to FIGS. 1-7. Next, FIG. 12, the dielectric layer 120 is etched, according to the same process as the previous embodiment, in a first area 135 arranged between the vertical line passing through the gate region 109 and the vertical line passing through the drain electrode 116, forming a cavity 140.

Here, the dielectric layer 120 is etched for a depth smaller than in the embodiment of FIG. 8, for the reason that will be explained hereinafter.

Figure 13:
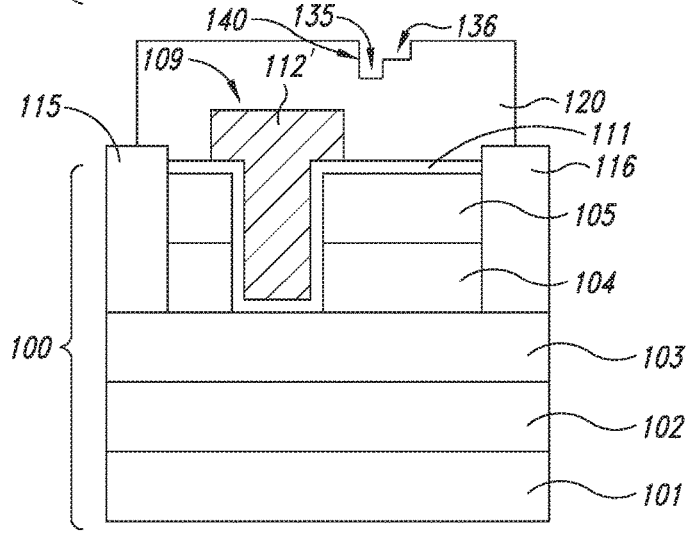

Then, FIG. 13, a second etch of the dielectric layer 120 is carried out. In detail, the second etch removes selective portions of the dielectric layer 120 in the first area 135 and in a second area 136, adjacent and contiguous to the first area 135, moving toward the drain electrode 116. Thereby, a widening and deepening of the cavity 140 is obtained, and the cavity now occupies the second area 136 and, in the first area 135, has a depth caused by the first and second etches.

Figure 14:
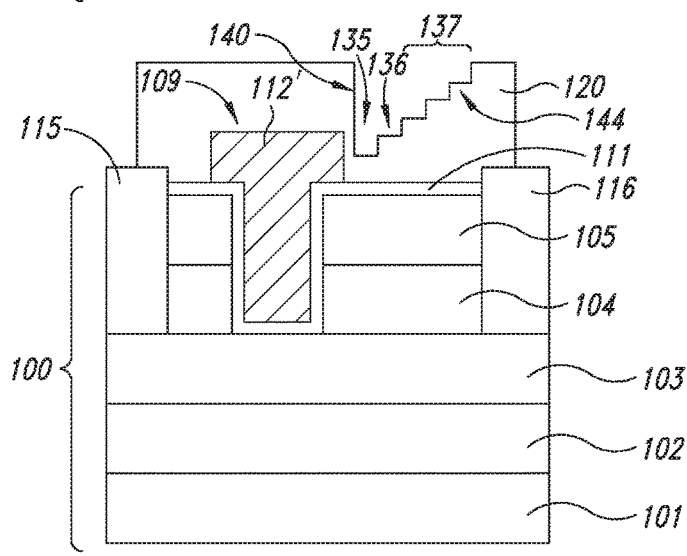

Next, FIG. 14, one or more further etches of the dielectric layer 120 are performed in the first and second areas 135, 136 and in a plurality of areas 137, adjacent and contiguous to each other as well as to the second area 136, arranged between the second area 136 and the vertical line passing through the drain electrode 116. Thereby, a further widening and deepening of the cavity 140 is obtained. Consequently, the cavity 140, in the first area 135, has a depth given by the sum of all the etches, in the second area 136 has a depth determined by the sum of the second and further etches and, in the plurality of areas 137, a depth that is progressively smaller. In this way, the cavity 140, in each further area 137, has a depth smaller than in an adjacent area moving toward the gate region 109 and a depth greater than in an adjacent area 137 moving toward the drain electrode 116.

At the end of the etching phase, in the embodiment of FIGS. 12-15, a single cavity 140 extends inside the dielectric layer 120; the cavity 140 is delimited, towards the wafer 100, by a staircase surface 144, the steps whereof are arranged at an increasing distance from the wafer 100 moving from the gate region 109 to the drain electrode 116.

Figure 15:
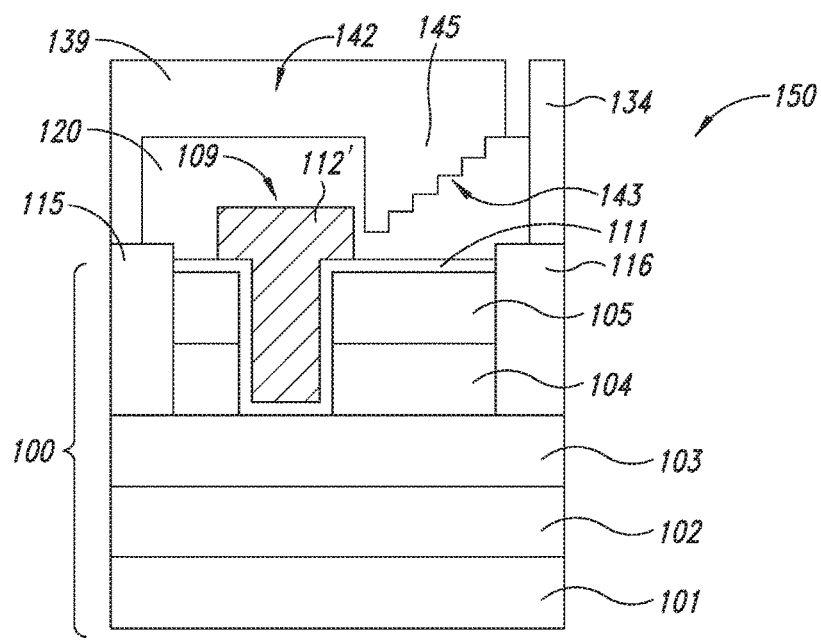

Next, FIG. 15, a metal layer is deposited over the dielectric layer 120, similar to what described with reference to FIG. 11. Then, the metal layer is defined, according to a photolithographic process, so as to obtain a field plate 142 and the drain contact 134. Here, the field plate 142 comprises the planar portion 139 and a single projecting portion 145, the bottom surface whereof (towards the wafer 100) reproduces the shape of the cavity 140 and thus has a plurality of steps 143.

After dicing the final wafer 100', an HEMT device 150 is obtained, which also here is of a normally off type.

Figure 16:
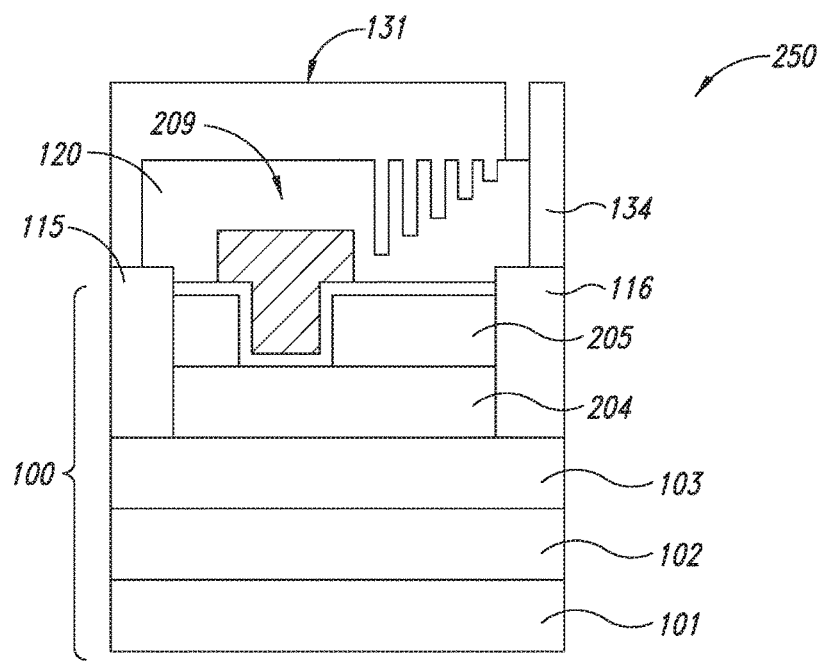
FIG. 16 shows a cross-section of a variant of the device of FIG. 11.

FIG. 16 shows a different embodiment where the gate region 209 extends through the passivation layer 205 alone and not through the barrier layer 204, thus forming an HEMT device 250 of a normally on type.

In FIG. 16, the field plate 131 is formed as in the first embodiment and has a plurality of projecting fingers 124 delimited by an envelope surface 133 defined by a plurality of steps 132.

As an alternative thereto, an HEMT device of a normally on type may be formed with a field plate having a single projecting portion, similar to the field plate 142 of FIG. 14, in a manner not shown.

The HEMT device described herein and the corresponding manufacturing process are advantageous as compared to the known solutions. In fact, the device has high planarity following upon a single planarization operation, thus facilitating electrical connection and not requiring repeated costly planarizations. Furthermore, the manufacturing process described comprises manufacturing steps that are in per se standard in semiconductor technology and are thus reliable and easy to control. The field plate 131, 142, as a whole, has a profile sloped towards the wafer 100, thus ensuring the desired optimization of the electrical field and voltage strength. The final HEMT device thus has high reliability.

Finally, it is clear that modifications and variations may be made to the process and to the device described and illustrated herein, without thereby departing from the scope of the present disclosure. For instance, the various embodiments described may be combined so as to provide further solutions.

In addition, in all the solutions, the number of steps of the bottom surface of the field plate (defined by the bottom end of the projecting fingers 124 of FIG. 11 or by the steps 132 of the single projecting portion 143 of FIG. 15) may range from two on.

Furthermore, the depth, width, and mutual distance of each step of the field plate 131, 142 may vary according the design specifications, and these parameters may be optimized by the designer without any difficulty.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A heterostructure field-effect transistor, comprising:
a body including a channel layer of a first semiconductor material; a barrier layer of a second semiconductor material, over the channel layer; and a passivation layer, over the barrier layer;
source and drain electrodes extending in the body;
a gate region extending in the body between the source and drain electrodes;
a dielectric layer over the gate region and over the passivation layer; and
a field plate of conductive material coupled to the source electrode and extending inside the dielectric layer in an area comprised between the gate region and the drain electrode, the field plate having a surface facing the wafer and having a plurality of steps, wherein the field plate comprises a planar portion extending over the dielectric layer and a plurality of projecting fingers, distinct from each other, the projecting fingers extending from the planar portion inside the dielectric layer towards the body.

2. The transistor according to claim 1, wherein the steps have an increasing distance from the body moving from the gate region to the drain electrode.

3. The transistor according to claim 1, wherein the body comprises a trench, and the gate region comprises a gate electrode and a gate insulation layer, the gate region is arranged inside the trench, and the gate insulation layer extends between the passivation layer and the dielectric layer and inside the trench, around the gate electrode.

4. The transistor according to claim 1, wherein the gate region extends inside the passivation layer.

5. The transistor according to claim 1, wherein the gate region extends inside the passivation layer and the barrier region.

6. The transistor according to claim 1, wherein the first and second semiconductor materials have different band gaps and comprise elements of Groups III-V of the Periodic Table.

7. The transistor according to claim 6, wherein the channel layer is of gallium nitride, and the barrier layer is of aluminum gallium nitride.

8. A field-effect transistor, comprising:
a semiconductor body;
source and drain electrodes extending in the body;
a gate region extending in the body between the source and drain electrodes;
a dielectric layer over the gate region and over the semiconductor body; and
a field plate of conductive material coupled to the source electrode and extending inside the dielectric layer in an area comprised between the gate region and the drain electrode, the field plate having a surface facing the wafer and having a plurality of steps, wherein the field plate comprises a planar portion extending over the dielectric layer and a plurality of projecting fingers, distinct from each other, the projecting fingers extending from the planar portion inside the dielectric layer towards the body.

9. The transistor according to claim 8, wherein the steps have an increasing distance from the body moving from the gate region to the drain electrode.

10. The transistor according to claim 8, wherein the plurality of projecting fingers includes a longest projecting finger that is positioned closest to the gate region among the plurality of projecting fingers.

11. A heterostructure field-effect transistor, comprising:
a semiconductor body;
source and drain electrodes extending in the body;
a gate region extending in the body between the source and drain electrodes;
a dielectric layer over the gate region and over the body; and
a field plate of conductive material coupled to the source electrode and extending inside the dielectric layer in an area comprised between the gate region and the drain electrode, the field plate having a surface facing the wafer and having a planar portion extending over the dielectric layer and a plurality of projecting fingers extending from the planar portion into the dielectric layer towards the body and having different lengths, the projecting fingers including a longest projecting finger that is positioned closest to the gate region among the plurality of projecting fingers.

12. The transistor according to claim 11, wherein the length of each projecting finger of the plurality of projecting fingers is shorter than the length of an immediately adjacent projecting finger that is closer to the longest projecting finger.

13. The transistor according to claim 11, wherein the projecting fingers of the plurality of projecting fingers are distinct from each other.

14. The transistor according to claim 11, wherein the semiconductor body includes a channel layer of a first semiconductor material; a barrier layer of a second semiconductor material, over the channel layer; and a passivation layer, over the barrier layer.

15. The transistor according to claim 14, wherein the body comprises a trench, and the gate region comprises a gate electrode and a gate insulation layer, the gate region is arranged inside the trench, and the gate insulation layer extends inside the trench, around the gate electrode.

16. The transistor according to claim 15, wherein the gate region extends inside the passivation layer and the barrier region.

* * * * *